US012027595B2

(12) United States Patent
Bai et al.

(10) Patent No.: US 12,027,595 B2
(45) Date of Patent: Jul. 2, 2024

(54) SEMICONDUCTOR STRUCTURE AND FABRICATION METHOD THEREOF, AND PERIPHERAL CIRCUIT

(71) Applicant: CHANGXIN MEMORY TECHNOLOGIES, INC., Hefei (CN)

(72) Inventors: Jie Bai, Hefei (CN); Kang You, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 464 days.

(21) Appl. No.: 17/468,634

(22) Filed: Sep. 7, 2021

(65) Prior Publication Data

US 2022/0310799 A1    Sep. 29, 2022

Related U.S. Application Data

(63) Continuation of application No. PCT/CN2021/111520, filed on Aug. 9, 2021.

(30) Foreign Application Priority Data

Mar. 24, 2021   (CN) .......................... 202110313417.3

(51) Int. Cl.
H01L 29/40 (2006.01)
H01L 21/02 (2006.01)
H01L 29/06 (2006.01)
H01L 29/423 (2006.01)

(52) U.S. Cl.
CPC ........ *H01L 29/401* (2013.01); *H01L 21/0206* (2013.01); *H01L 21/02068* (2013.01); *H01L 29/0607* (2013.01); *H01L 29/42364* (2013.01)

(58) Field of Classification Search
None
See application file for complete search history.

(56) References Cited

U.S. PATENT DOCUMENTS

| 2010/0062590 A1* | 3/2010 | Lin .................... H01L 21/31111 |
| | | 438/585 |
| 2011/0237063 A1 | 9/2011 | Kim et al. |
| 2016/0181107 A1* | 6/2016 | Shin .................. H01L 21/32137 |
| | | 438/592 |

FOREIGN PATENT DOCUMENTS

| CN | 101794071 A | 8/2010 |
| CN | 102403198 A | 4/2012 |
| CN | 102460662 A | 5/2012 |
| CN | 105719960 A | 6/2016 |
| CN | 113078209 A | 7/2021 |

* cited by examiner

*Primary Examiner* — Michelle Mandala
*Assistant Examiner* — Jordan M Klein
(74) *Attorney, Agent, or Firm* — Kilpatrick Townsend & Stockton LLP

(57) ABSTRACT

Embodiments relate to a method for fabricating a semiconductor structure, a semiconductor structure, and a peripheral circuit. The method for fabricating a semiconductor structure includes: providing a substrate; forming a gate initial structure and a residue on the substrate; and removing the residue by means of a first cleaning liquid. The first cleaning liquid is capable of inhibiting the residue from undergoing a hydrolysis reaction.

14 Claims, 3 Drawing Sheets

SEMICONDUCTOR STRUCTURE AND FABRICATION METHOD THEREOF, AND PERIPHERAL CIRCUIT

CROSS-REFERENCE TO RELATED APPLICATION

This application is a continuation of PCT/CN2021/111520, filed on Aug. 9, 2021, which claims priority to Chinese Patent Application No. 2021103134173 titled "SEMICONDUCTOR STRUCTURE AND FABRICATION METHOD THEREOF, AND PERIPHERAL CIRCUIT" and filed to the State Intellectual Property Office on Mar. 24, 2021, the entire contents of which are incorporated herein by reference.

TECHNICAL FIELD

The present disclosure relates to the field of semiconductor technology, and more particularly, to a semiconductor structure and a fabrication method thereof, and a peripheral circuit.

BACKGROUND

As a size of a transistor decreases, a thickness of a gate dielectric layer and a pitch between a source and a drain both decrease further, which causes a leakage current between a gate and the drain and a leakage current between the source and the drain to increase dramatically, such that the gate dielectric layer formed by conventional materials such as silicon dioxide and silicon oxynitride cannot meet industry requirements.

A high dielectric constant gate dielectric can increase a physical thickness of a gate dielectric while keeping a gate capacitance unchanged, thus achieving a dual purpose of reducing a gate leakage current and improving device reliability. Therefore, gate structures with high dielectric constant dielectric layers are widely used in transistors for integrated circuits (especially for peripheral circuits).

However, fabrication of the gate structures with high dielectric constant dielectric layers may generate etch residues that are difficult to remove, which not only causes defects but also reduces product yield.

SUMMARY

According to some embodiments, a first aspect of the present disclosure discloses a method for fabricating a semiconductor structure, comprising:
providing a substrate;
forming a gate initial structure and a residue on the substrate; and
removing the residue by means of a first cleaning liquid;
The first cleaning liquid is capable of inhibiting the residue from undergoing a hydrolysis reaction.

According to some embodiments, a second aspect of the present disclosure discloses a semiconductor structure, which is formed by the above method for fabricating a semiconductor structure.

According to some embodiments, a third aspect of the present disclosure discloses a peripheral circuit comprising the above-described semiconductor structure.

In the above-mentioned method for fabricating a semiconductor structure, the residue is removed by means of a first cleaning liquid. The first cleaning liquid can inhibit the residue from undergoing a hydrolysis reaction, thereby preventing the hydrolysis reaction of the residue from generating precipitates insoluble in water, organic matters, acid or base, which are difficult to be removed. Therefore, the embodiments of the present disclosure can effectively prevent generation of defects, and thus can effectively improve quality of a formed gate structure and product yield.

BRIEF DESCRIPTION OF THE DRAWINGS

To describe the technical solutions in the embodiments of the present disclosure or the existing technologies more clearly, the accompanying drawings required for describing the embodiments or the existing technologies will be briefly introduced below. Apparently, the accompanying drawings in the following description are merely some embodiments of the present disclosure. To those of ordinary skills in the art, other accompanying drawings may also be derived from these accompanying drawings without creative efforts.

DETAILED DESCRIPTION

Figure 1:
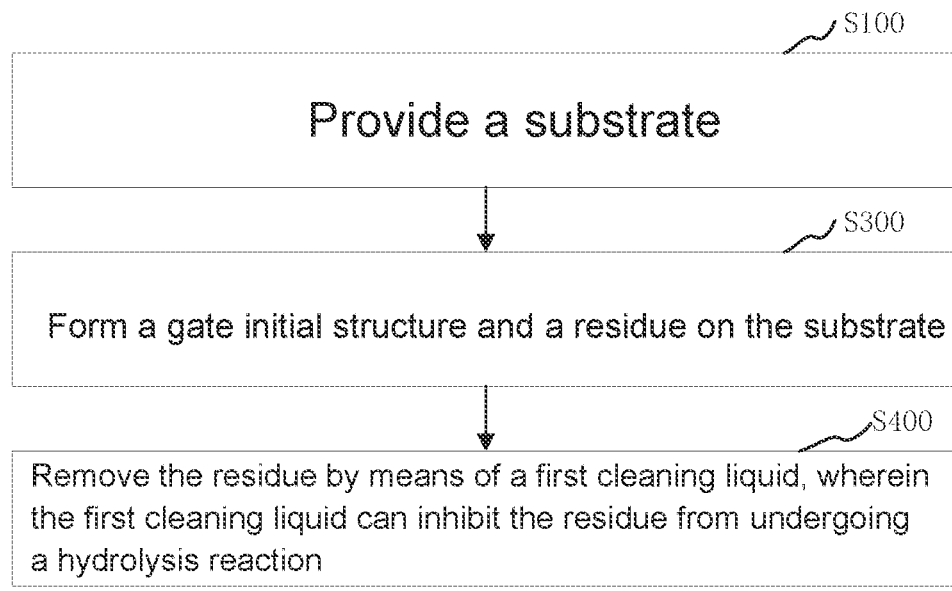
FIG. 1 illustrates a flowchart of a method for fabricating a semiconductor structure according to an embodiment.

For ease of understanding the present disclosure, the present disclosure will be described more fully hereinafter with reference to the accompanying drawings. Some embodiments of the present disclosure are provided in the accompanying drawings. The present disclosure may, however, be embodied in many different forms and should not be limited to the embodiments set forth herein. Rather, these embodiments are provided so that the present disclosure will be more thorough and complete.

Unless otherwise defined, all technical and scientific terms employed herein have the same meaning as commonly understood by one of ordinary skill in the art to which the present disclosure belongs. The terms employed in the specification of the present disclosure are merely for the purpose of describing some embodiments and are not intended for limiting the present disclosure.

It should be understood that when an element or layer is referred to as being "on", "adjacent to", "connected to" or "coupled to" other elements or layers, it may be directly on, adjacent to, connected or coupled to the other elements or layers, or intervening elements or layers may be present. In contrast, when an element is referred to as being "directly on", "directly adjacent to", "directly connected to" or "directly coupled to" other elements or layers, there are no intervening elements or layers present.

It should be understood that although the terms first, second, third, etc. may be employed to describe various elements, components, regions, layers, doping types and/or sections, these elements, components, regions, layers, doping types and/or sections should not be limited by these terms. These terms are only employed to distinguish one element, component, region, layer, doping type, or section from another element, component, region, layer, doping type, or section. Therefore, without departing from the teachings of the present disclosure, a first element, component, region, layer, doping type, or section discussed below may be represented as a second element, component, region, layer, doping type, or section.

Spatially relative terms such as "below", "under", "lower", "beneath", "above", "upper" and the like may be used herein to describe relationships between one element or feature as shown in the figures and another element(s) or feature(s). It should be understood that the spatially relative terms may be intended to encompass different orientations of the device in use or operation in addition to the orientation depicted in the figures. For example, if the device in the figures is turned over, elements or features described as "under", "beneath" or "below" other elements would then be oriented "above" the other elements or features. Thus, the example term "under", "below" or "beneath" may encompass both an orientation of above and below. In addition, the device may also be otherwise oriented (for example, rotated 90 degrees or at other orientations) and the spatially relative descriptors used herein should be interpreted accordingly.

As used herein, the singular forms of "a", "one" and "said/the" are also intended to include plural forms, unless the context clearly indicates otherwise. It should also be understood that the terms "comprising" and/or "including", when used in this specification, may determine the presence of the described features, integers, steps, operations, elements and/or components, but do not preclude the presence or addition of one or more other features, integers, steps, operations, elements, components, and/or groups thereof. Meanwhile, as used herein, the term "and/or" includes any and all combinations of related listed items.

Embodiments of the present disclosure are described herein with reference to cross-sectional illustrations serving as schematic illustrations of idealized embodiments (and intermediate structures) of the present disclosure. As such, variations from the shapes of the illustrations as a result, for example, of manufacturing techniques and/or tolerances, may be expected. Thus, embodiments of the present disclosure should not be construed as being limited to particular shapes of regions illustrated herein but may include deviations in shapes that result, for example, from fabrication technologies.

The method for fabricating a semiconductor structure and the semiconductor structure provided by the embodiments of the present disclosure can be, but not limited to, applied to transistors in peripheral circuits.

Figure 2:
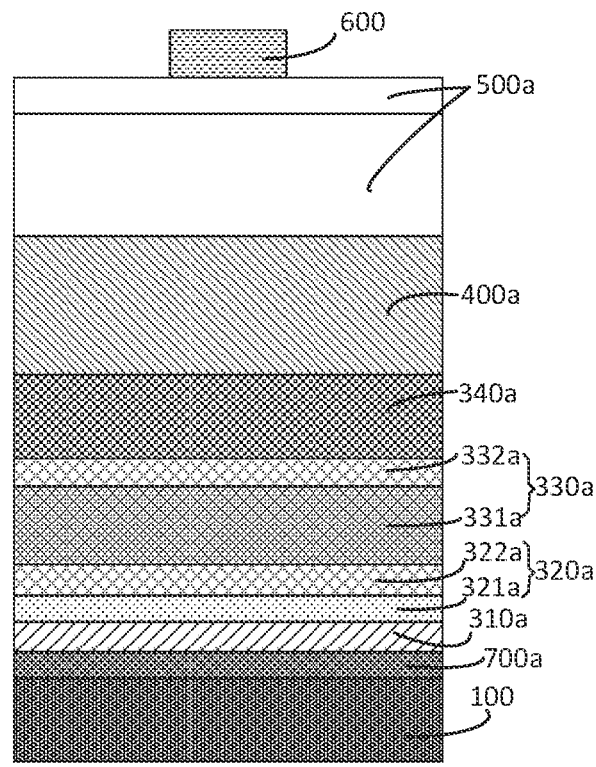
FIG. 2 illustrates a schematic structural diagram in a process of forming a semiconductor structure according to an embodiment.
Figure 3:
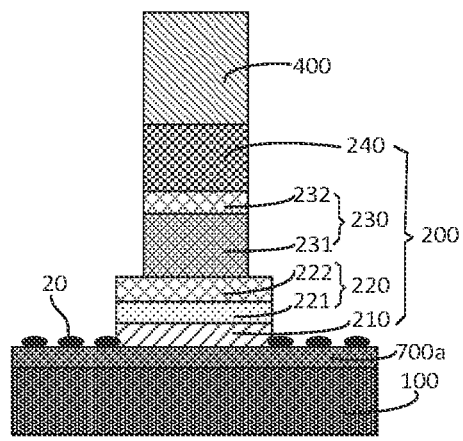
FIG. 3 illustrates a schematic structural diagram of a semiconductor structure according to an embodiment.
Figure 4:
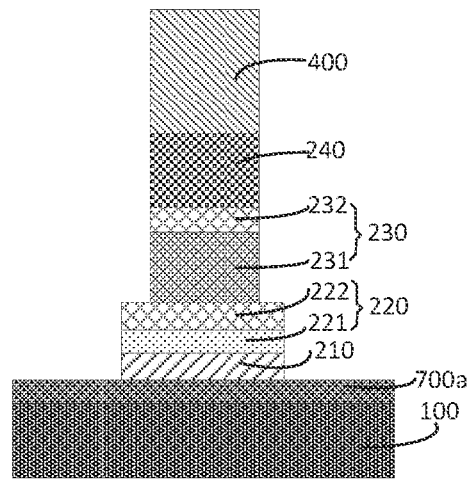
FIG. 4 illustrates a schematic structural diagram of a semiconductor structure cleaned by a first cleaning liquid according to an embodiment.

In one embodiment, referring to FIG. 1, there is provided a method for fabricating a semiconductor structure, including following steps:

Step S100: providing a substrate 100, referring to FIG. 2;

Step S300: forming a gate initial structure 200 and a residue 20 on the substrate 100, referring to FIG. 2, and FIG. 3; and Step S400: removing the residue 20 by means of a first cleaning liquid, referring to FIG. 4.

In Step S100, the substrate may include, but is not limited to, a semiconductor substrate such as silicon, germanium, or germanium-silicon. The substrate 100 positioned under a gate structure of a transistor is configured to form a conductive channel between a source region and a drain region.

In Step S300, the residue 20 is a residue generated during the process of forming the gate initial structure 200. The gate initial structure 200 is an initial structure of a finally formed gate structure 300.

In Step S400 of this embodiment, the residue 20 is removed by means of the first cleaning liquid. The first cleaning liquid can inhibit the residue 20 from undergoing a hydrolysis reaction, thereby preventing the hydrolysis reaction of the residue from generating precipitates insoluble in water, organic matters, acid or base, which are difficult to be removed.

The residue 20 is removed by means of the first cleaning liquid, referring to FIG. 4.

Therefore, this embodiment can effectively remove the residue generated during the process of formation of the gate structure, thereby preventing defects from being generated, and thus effectively improving quality of the gate structure formed and product yield.

Figure 5:
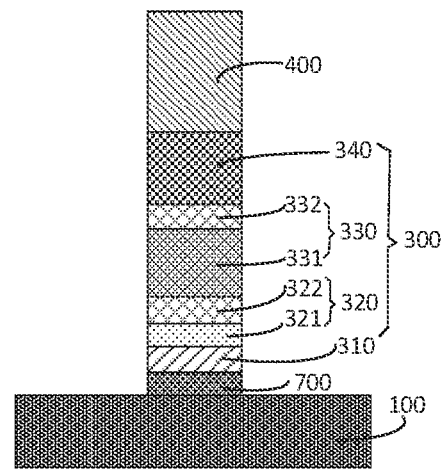
FIG. 5 illustrates a schematic structural diagram of a semiconductor structure cleaned by a second cleaning liquid according to an embodiment.

In one embodiment, referring to FIG. 5, the finally formed gate structure 300 may include a gate dielectric layer 310 and a gate metal layer 340.

In some embodiments, a material of the gate dielectric layer 310 may be a high dielectric constant dielectric material such as hafnium silicate ($HfSiO_x$) or hafnium oxide ($HfO_2$). A material of the gate metal layer 340 may be tungsten metal (W), etc.

In some embodiments, the gate structure 300 may also include a regulating layer 320 and a work function layer 330.

The regulating layer 320 may regulate a threshold voltage of the transistor, and may include one film layer or a plurality of film layers. For example, the regulating layer 320 includes a first regulating sublayer 321 and a second regulating sublayer 322.

The first regulating sublayer 321 may be formed on the gate dielectric layer 310 formed of the high dielectric constant dielectric material, and a material of the first regulating sublayer 321 may be lanthanum oxide (LaO), etc.

The second regulating sublayer 322 may be formed on the first regulating sublayer 321 and has a suitable work function. A material of the second regulating sublayer 322 may be titanium nitride (TiN), etc.

The work function layer 330 may also be configured to regulate the threshold voltage of the transistor. In some embodiments, the work function layer 330 may include a first work function sublayer 331 and a second work function sublayer 332.

The first work function sublayer 331 may be formed on the second regulating sublayer 322, and a material of the first work function sublayer 331 may be polysilicon, etc.

The second work function sublayer 332 may be formed on the first work function sublayer 331, and also can prevent the first work function sublayer 331 from reacting with the gate metal layer 340. A material of the second work function sublayer 332 may be titanium nitride (TiN), etc.

Step S300 may include:

Step S310: forming a gate dielectric material layer 310a, a regulating material layer 320a, a work function material layer 330a, and a gate metal material layer 340a in sequence on the substrate 100, referring to FIG. 2;

Step S320: forming a first mask material layer 400a on the gate metal material layer 340a, referring to FIG. 2;

Step S330: patterning the first mask material layer 400a to form a first mask layer 400, referring to FIG. 2 and FIG. 3; and Step S340: dry-etching the gate metal material layer 340a, the work function material layer 330a, the regulating material layer 320a, and the gate dielectric material layer 310a in sequence based on the first mask layer 400, to form the gate initial structure 200 and generate the residue 20, referring to FIG. 2 and FIG. 3.

In Step S310, referring to FIGS. 2 to 5, the gate dielectric material layer 310a is configured to form a gate dielectric initial layer 210 of the gate initial structure 200, and the gate dielectric initial layer 210 is configured to form the gate dielectric layer 310 of the gate structure 300. The regulating material layer 320a is configured to form a regulating initial layer 220 of the gate initial structure 200, and the regulating initial layer 220 is configured to form the regulating layer 320 of the gate structure 300. The work function material layer 330a is configured to form a work function initial layer 230 of the gate initial structure 200, and the work function initial layer 230 is configured to form the work function layer 330 of the gate structure 300. The gate metal material layer 340a is configured to form a gate metal initial layer 240 of the gate initial structure 200, and the gate metal initial layer 240 is configured to form the gate metal layer 340 of the gate structure 300.

The regulating material layer 320a may include a first regulating sub-material layer 321a and a second regulating sub-material layer 322a. The first regulating sub-material layer 321a is configured to form a first regulating initial sublayer 221 of the gate initial structure 200, wherein the first regulating initial sublayer 221 is configured to form the first regulating sublayer 321 of the gate structure 300. The second regulating sub-material layer 322a is configured to form a second regulating initial sublayer 222 of the gate initial structure 200, wherein the second regulating initial sublayer 222 is configured to form the second regulating sublayer 322 of the gate structure 300.

The work function material layer 330a may include a first work function sub-material layer 331a and a second work function sub-material layer 332a. The first work function sub-material layer 331a is configured to form a first work function initial sublayer 231 of the gate initial structure 200, wherein the first work function initial sublayer 231 is configured to form the first work function sublayer 331 of the gate structure 300. The second work function sub-material layer 332a is configured to form a second work function initial sublayer 232 of the gate initial structure 200, wherein the second work function initial sublayer 232 is configured to form the second work function sublayer 332 of the gate structure 300.

In Step S320, as an example, a material of the first mask material layer 400a may be a nitride, such as silicon nitride.

In Step S330, the first mask material layer 400a may be dry-etched based on the mask layer, to form the patterned first mask layer 400.

In Step S340, the residue 20 may be generated during the process of dry etching based on the first mask layer 400 to form the gate initial structure 200.

In this embodiment, when the gate metal material layer 340a, the work function material layer 330a, the regulating material layer 320a, and the gate dielectric material layer 310a are dry-etched in sequence based on the first mask layer 400, an etching gas may react with an etched film layer, such that the residue 20 is generated.

For example, when the regulating layer 320 includes the first regulating sublayer 321 made from LaO, the regulating material layer 320a includes the first regulating sub-material layer 321a made from LaO. In this case, when the first regulating sub-material layer 321a is dry-etched by means of a gas containing $Cl_2$, the etching gas reacts with LaO, such that $LaCl_3$ is produced. The residue $LaCl_3$ has a higher boiling point and is difficult to be removed.

In this case, in Step S400 the first cleaning liquid is employed to inhibit the residue 20 from undergoing a hydrolysis reaction, thereby preventing the hydrolysis reaction of the residue from generating precipitates insoluble in water, organic matters, acid or base, which are difficult to be removed.

In one embodiment, Step S330 includes:
Step S331: forming a second mask material layer 500a on the first mask material layer 400a;
Step S332: patterning the second mask material layer 500a based on a photolithography process to form the second mask layer;
Step S333: the first mask material layer 400a is dry-etched based on the second mask layer to form the patterned first mask layer 400.

In Step S331, referring to FIG. 2, the second mask material layer 500a may include one or more film layers. For example, the second mask material layer 500a may include an organic spin on carbon (SOH) material layer and a silicon oxynitride (SiON) material layer thereon.

In Step S332, in some embodiments, referring to FIG. 2, after the second mask material layer 500a is formed, a photoresist may be formed on the second mask material layer 500a, and then the photoresist layer is patterned based on the photolithography process to form a patterned photoresist layer 600.

Next, the second mask material layer 500a is dry-etched based on the patterned photoresist layer 600 to form the patterned second mask layer. Next, the patterned photoresist layer 600 is removed.

After Step S333, the second mask layer may be removed.

In one embodiment, the residue includes $LaCl_3$, and the first cleaning liquid includes HCL solution.

In this case, as mentioned before, the $LaCl_3$ here may be the residue generated when dry-etching the first regulating sub-material layer 321a (made from LaO). Of course, when other etched film layer includes lanthanum (La), $LaCl_3$ in this embodiment may also be the residue generated in the process of etching the other etched film layer.

$LaCl_3$ is soluble in water but is highly susceptible to hydrolysis, producing a precipitate LaClO insoluble in water, organic matters, and a vast majority of acids or bases, wherein a hydrolysis reaction is as follows:

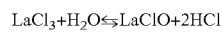
$$LaCl_3 + H_2O \rightleftharpoons LaClO + 2HCl$$

The above reaction is reversible, and addition of hydrochloric acid can inhibit the hydrolysis reaction, thereby preventing the hydrolysis reaction of the residue from generating precipitates insoluble in water, organic matters, acid or base, which are difficult to be removed.

In some embodiments, concentration of the HCL solution may be set between 1% and 38% to effectively inhibit hydrolysis of $LaCl_3$. For example, the concentration of the HCL solution may be set to 3%, 7%, 11%, 15%, 19%, 23%, 27%, 31% or 35%, etc. If the concentration is set too low, the hydrolysis reaction cannot be effectively inhibited. However, if the concentration is set too high, it may cause damage to the regulating initial layer 220, and thus having a negative effect on device performance. For example, when the regulating initial layer 220 contains LaO, a higher concentration of the HCL solution may cause damage to LaO.

In one embodiment, referring to FIG. 3, the gate initial structure 200 formed in Step S300 includes a first portion and a second portion.

The first portion is positioned above the substrate 100, and the second portion is positioned on an upper surface of the first portion. An orthographic projection of the second portion on the substrate is positioned inside an orthographic projection of the first portion on the substrate.

A portion of the first portion that protrudes with respect to the second portion is a corner of the gate initial structure 200. Presence of this portion may have a negative effect on subsequent fabrication processes and thus having a negative effect on performance of the transistor.

Figure 6:
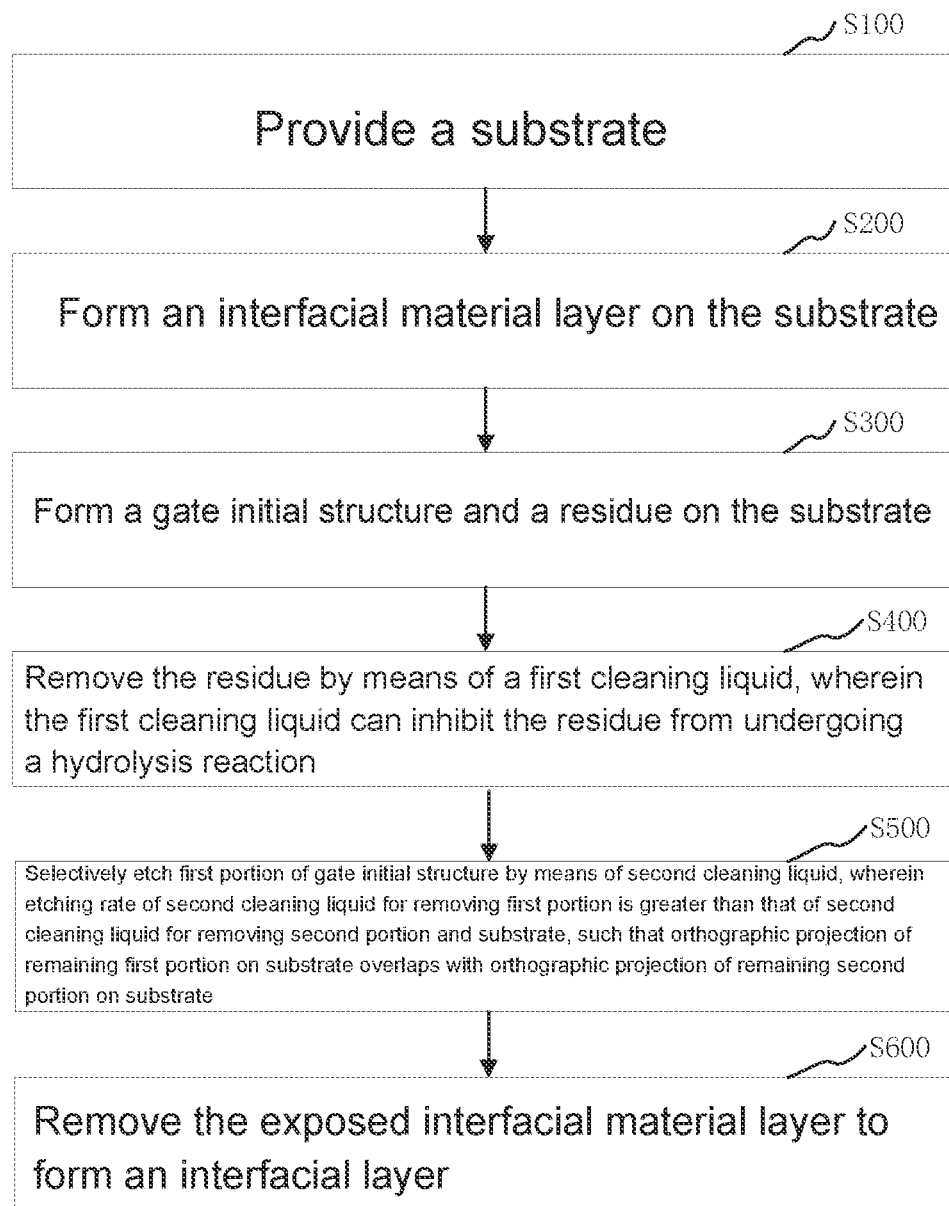
FIG. 6 illustrates a flowchart of a method for fabricating a semiconductor structure according to another embodiment.

In this embodiment, referring to FIG. 6, after Step S400, the method further includes:

Step S500: selectively etching the first portion by means of a second cleaning liquid, wherein an etching rate of the second cleaning liquid for removing the first portion is greater than that of the second cleaning liquid for removing the second portion and the substrate 100, such that the orthographic projection of the remaining first portion on the substrate 100 overlaps with the orthographic projection of the remaining second portion on the substrate 100.

Based on the application of the second cleaning liquid, the corner of the gate initial structure 200 may be selectively etched, such that the orthographic projection of the remaining first portion on the substrate 100 overlaps with the orthographic projection of the second portion on the substrate 100. In this way, a high-quality gate structure 300 is obtained.

In one embodiment, referring to FIG. 3, after the gate metal material layer 340a, the work function material layer 330a, the regulating material layer 320a, and the gate dielectric material layer 310a are dry-etched based on the first mask layer 400 in Step S340, the gate metal material layer 340a may form a gate metal initial layer 240 more consistent in pattern with the first mask layer 400, and the work function material layer 330a may form a work function initial layer 230 more consistent in pattern with the first mask layer 400. By adjusting etching results of the regulating material layer 320a and the gate dielectric material layer 310a, the regulating initial layer 220 and the gate dielectric initial layer 210 formed by etching have a larger width than the work function initial layer 230, such that when the residue is cleaned, a protective effect may be exerted on the gate dielectric layer 310 and the regulating layer 320 subsequently formed.

In this case, the gate metal initial layer 240 and the function initial layer 230 may constitute the second portion. The regulating initial layer 220 and the gate dielectric initial layer 210 may constitute the first portion.

In this case, referring to FIG. 4 and FIG. 5, after the first portion is selectively etched by means of the second cleaning liquid in Step S500, the gate metal initial layer 240 of the second portion forms the gate metal layer 340, the work function initial layer 230 of the second portion forms the work function layer 330, the regulating initial layer 220 of the first portion forms the regulating layer 320, and the gate dielectric initial layer 210 of the first portion forms the gate dielectric layer 310. The gate dielectric layer 310, the regulating layer 320, the work function layer 330 and the gate metal layer 340 constitute the gate structure.

An etching rate of the second cleaning liquid for removing the first portion is greater than that of the second cleaning liquid for removing the second portion and the substrate 100 in Step S500, such that the orthographic projection of the remaining first portion (the gate dielectric layer 310 and the regulating layer 320) on the substrate 100 overlaps with the orthographic projection of the remaining second portion (the work function layer 330 and the gate metal layer 340) on the substrate 100. In this way, a high-quality gate structure 300 can be obtained.

In some embodiments, the work function initial layer 230 may include the first work function initial sublayer 231 formed by the first work function sub-material layer 331a and the second work function initial sublayer 232 formed by the second work function sub-material layer 332a. In this case, the first work function initial sublayer 231 forms the first work function sublayer 331 after Step S500. The second work function initial sublayer 232 forms the second work function sublayer 332. The first work function sublayer 331 and the second work function sublayer 332 constitute the work function layer 330.

As an example, the first work function initial sublayer 231 may be a polysilicon film layer, and the second work function initial sublayer 232 may be a second TiN film layer. The gate metal initial layer may include a tungsten metal film layer.

Meanwhile, the regulating initial layer 220 may include the first regulating initial sublayer 221 formed by the first regulating sub-material layer 321a and the second regulating initial sublayer 222 formed by the second regulating sub-material layer 322a. In this case, after Step S500, the first regulating initial sublayer 221 forms the first regulating sublayer 321, and the second regulating initial sublayer 222 forms the second regulating sublayer 322. The first regulating sublayer 321 and the second regulating sublayer 322 constitute the regulating layer 320.

Of course, in other embodiments, the film layers included in the first portion and the second portion may be different from the film layer herein, which is not limited in the present disclosure.

In one embodiment, the gate dielectric initial layer 210 includes an HfSiO$_x$ film layer, and the regulating initial layer 220 includes a LaO film layer and a first TiN film layer. The LaO film layer may be the first regulating initial sublayer 221 described above, and the first TiN film layer may be the second regulating initial sublayer 222 described above.

Meanwhile, in this embodiment, the second cleaning liquid includes at least one of a hydrofluoric acid (HF) solution or a disodium hydrogen phosphate (DSP) solution. For example, the DSP solution includes ultra-pure water, sulfuric acid, and hydrogen peroxide, and a volume ratio of the ultra-pure water, the sulfuric acid and the hydrogen peroxide is 85-95: 3-5:5-10. The volume ratio may ensure the etching rate of the first portion of the gate initial structure 200, without causing excessive damage to the second portion of the gate initial structure 200.

In one embodiment, a mixed solution of HF and DSP has a higher selectivity to the HfSiO$_x$ film layer, the LaO film layer and the TiN film layer, which allows to selectively etch a less easily etched portion such as a corner, such that the first portion can be effectively etched.

In one embodiment, referring to FIG. 6, before Step S300, the method also includes:

Step S200: forming an interfacial material layer 700a on the substrate 100, referring to FIG. 2.

A material of the interfacial material layer 700a may include, but is not limited to, silicon dioxide (SiO$_2$).

In some embodiments, after Step S500, the method may also include:

Step S600: removing the exposed interfacial material layer 700a. In this case, the remaining interfacial material layer 700a forms an interfacial layer 700, referring to FIG. 5.

In one embodiment, the exposed interfacial material layer 700a is removed after the first portion of the gate initial structure is etched by means of the second cleaning liquid, and the interfacial material layer 700a can provide protection to the surface of the substrate, thereby preventing the second cleaning liquid from causing damage to the substrate.

When the gate dielectric material layer 310a having a high dielectric constant is directly applied to the semiconductor substrate 100, an oxygen vacancy or the like may be generated, which may lead to an interfacial defect between the gate dielectric material layer 310a and the substrate 100.

The formation of the interfacial material layer 700a can effectively reduce the interfacial defect. Furthermore, the interfacial layer 700 formed by this interfacial material layer 700a also can improve thermal stability, reduce a tunneling of the gate dielectric layer 310 formed by penetrating through the gate dielectric material layer 310a, and improve mobility of charge carrier passing through the channel region of the transistor.

In one embodiment, there is also provided a semiconductor structure, which is formed by means of the method for fabricating a semiconductor structure provided in the above embodiment.

In one embodiment, there is also provided a peripheral circuit, which comprises a semiconductor structure formed by means of the method for fabricating a semiconductor structure provided in the above embodiment.

It is to be understood that, at least some of the steps in FIG. 1 may include a plurality of steps or a plurality of stages, which are not necessarily performed at the same moment, but may be executed at different moments, and the order of execution of these steps or stages is not necessarily performed sequentially, but may be performed alternately or alternately with at least a portion of the steps or stages of other steps or other steps.

Technical features of the above embodiments may be arbitrarily combined. For simplicity, all possible combinations of the technical features in the above embodiments are not described. However, as long as the combination of these technical features is not contradictory, it shall be deemed to be within the scope recorded in this specification.

The above embodiments merely express a plurality of implementations of the present disclosure, and descriptions thereof are relatively concrete and detailed. However, these embodiments are not thus construed as limiting the patent scope of the present disclosure. It is to be pointed out that for persons of ordinary skill in the art, some modifications and improvements may be made under the premise of not departing from a conception of the present disclosure, which shall be regarded as falling within the scope of protection of the present disclosure. Thus, the scope of protection of the present disclosure shall be subject to the appended claims.

What is claimed is:

1. A method for fabricating a semiconductor structure, comprising:
    providing a substrate;
    forming a gate initial structure and a residue on the substrate; wherein the gate initial structure comprises a first portion and a second portion, the first portion being positioned above the substrate, the second portion being positioned on an upper surface of the first portion, and an orthographic projection of the second portion on the substrate being positioned inside an orthographic projection of the first portion on the substrate;
    removing the residue by means of a first cleaning liquid; wherein the first cleaning liquid is capable of inhibiting the residue from undergoing a hydrolysis reaction; and
    selectively etching the first portion by means of a second cleaning liquid, an etching rate of the second cleaning liquid for removing the first portion being greater than that of the second cleaning liquid for removing the second portion and the substrate, such that the orthographic projection of a remaining first portion on the substrate overlaps with the orthographic projection of a remaining second portion on the substrate.

2. The method for fabricating a semiconductor structure according to claim 1, wherein
    a product of the hydrolysis reaction of the residue is insoluble in water, an organic matter, acid or base.

3. The method for fabricating a semiconductor structure according to claim 1, wherein the residue comprises $LaCl_3$, and the first cleaning liquid comprises HCl solution.

4. The method for fabricating a semiconductor structure according to claim 3, wherein the HCl solution has a mass concentration of 1%-38%.

5. The method for fabricating a semiconductor structure according to claim 1, wherein the first portion comprises a gate dielectric initial layer and a regulating initial layer stacked in sequence on the substrate, the second portion comprising a work function initial layer and a gate metal initial layer stacked in sequence.

6. The method for fabricating a semiconductor structure according to claim 5, wherein the gate dielectric initial layer comprises an $HfSiO_x$ film layer, the regulating initial layer comprising an LaO film layer and a first TiN film layer, and the second cleaning liquid comprising at least one of an HF solution or a DSP solution.

7. The method for fabricating a semiconductor structure according to claim 6, wherein the second cleaning liquid comprises a DSP solution, the DSP solution comprising ultra-pure water, sulfuric acid and hydrogen peroxide, and a volume ratio of the ultra-pure water, the sulfuric acid and the hydrogen peroxide being 85-95:3-5:5-10.

8. The method for fabricating a semiconductor structure according to claim 5, wherein the work function initial layer comprises a polysilicon film layer and a second TiN film layer.

9. The method for fabricating a semiconductor structure according to claim 5, wherein the gate metal initial layer comprises a tungsten metal film layer.

10. The method for fabricating a semiconductor structure according to claim 1, wherein before forming a gate initial structure on the substrate, the method further comprises:
    forming an interfacial material layer on the substrate.

11. The method for fabricating a semiconductor structure according to claim 10, wherein after selectively etching the first portion by means of the second cleaning liquid, the etching rate of the second cleaning liquid for removing the first portion being greater than that of the second cleaning liquid for removing the second portion and the substrate, such that the orthographic projection of the remaining first portion on the substrate overlaps with the orthographic projection of the remaining second portion on the substrate, the method further comprises:
    removing the exposed interfacial material layer to form an interfacial layer.

12. The method for fabricating a semiconductor structure according to claim 1, wherein the forming a gate initial structure and a residue on the substrate comprises:
    forming a gate dielectric material layer, a regulating material layer, a work function material layer, and a gate metal material layer in sequence on the substrate;
    forming a first mask material layer on the gate metal material layer;
    patterning the first mask material layer to form a first mask layer; and
    dry-etching the gate metal material layer, the work function material layer, the regulating material layer and the gate dielectric material layer in sequence based on the first mask layer to form the gate initial structure and to produce the residue.

13. A semiconductor structure formed by a method for fabricating the semiconductor structure, the method comprises:
   providing a substrate;
   forming a gate initial structure and a residue on the substrate; wherein the gate initial structure comprises a first portion and a second portion, the first portion being positioned above the substrate, the second portion being positioned on an upper surface of the first portion, and an orthographic projection of the second portion on the substrate being positioned inside an orthographic projection of the first portion on the substrate;
   removing the residue by means of a first cleaning liquid; wherein the first cleaning liquid is capable of inhibiting the residue from undergoing a hydrolysis reaction; and
   selectively etching the first portion by means of a second cleaning liquid, an etching rate of the second cleaning liquid for removing the first portion being greater than that of the second cleaning liquid for removing the second portion and the substrate, such that the orthographic projection of a remaining first portion on the substrate overlaps with the orthographic projection of a remaining second portion on the substrate.

14. A peripheral circuit, comprising a semiconductor structure formed by a method for fabricating the semiconductor structure, the method comprises:
   providing a substrate;
   forming a gate initial structure and a residue on the substrate; wherein the gate initial structure comprises a first portion and a second portion, the first portion being positioned above the substrate, the second portion being positioned on an upper surface of the first portion, and an orthographic projection of the second portion on the substrate being positioned inside an orthographic projection of the first portion on the substrate;
   removing the residue by means of a first cleaning liquid; wherein the first cleaning liquid is capable of inhibiting the residue from undergoing a hydrolysis reaction; and
   selectively etching the first portion by means of a second cleaning liquid, an etching rate of the second cleaning liquid for removing the first portion being greater than that of the second cleaning liquid for removing the second portion and the substrate, such that the orthographic projection of a remaining first portion on the substrate overlaps with the orthographic projection of a remaining second portion on the substrate.

* * * * *